(12) United States Patent
Negishi et al.

(10) Patent No.: US 11,145,712 B2
(45) Date of Patent: Oct. 12, 2021

(54) SEMICONDUCTOR APPARATUS AND METHOD FOR MANUFACTURING THE SAME

(71) Applicant: Mitsubishi Electric Corporation, Chiyoda-ku (JP)

(72) Inventors: Tetsu Negishi, Chiyoda-ku (JP); Shoichi Kuga, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/092,409

(22) PCT Filed: Apr. 24, 2017

(86) PCT No.: PCT/JP2017/016213
§ 371 (c)(1),
(2) Date: Oct. 9, 2018

(87) PCT Pub. No.: WO2017/199698
PCT Pub. Date: Nov. 23, 2017

(65) Prior Publication Data
US 2020/0058733 A1     Feb. 20, 2020

(30) Foreign Application Priority Data
May 17, 2016  (JP) .............................. JP2016-098721

(51) Int. Cl.
*H01L 29/06*    (2006.01)
*H01L 23/29*    (2006.01)
(Continued)

(52) U.S. Cl.
CPC .......... *H01L 29/0619* (2013.01); *H01L 23/29* (2013.01); *H01L 23/31* (2013.01); *H01L 29/7393* (2013.01)

(58) Field of Classification Search
CPC . H01L 23/31; H01L 23/3157; H01L 23/3171; H01L 29/0619; H01L 23/29; H01L 29/16; H01L 29/06
See application file for complete search history.

(56) References Cited

U.S. PATENT DOCUMENTS

2007/0138596 A1* 6/2007 Kitamura .............. H01L 23/585
257/565
2010/0314629 A1* 12/2010 Tarui ................... H01L 29/0615
257/77

(Continued)

FOREIGN PATENT DOCUMENTS

JP       2013-191716 A     9/2013

OTHER PUBLICATIONS

International Search Report dated Jul. 4, 2017 in PCT/JP2017/016213 filed Apr. 24, 2017.

*Primary Examiner* — Sarah K Salerno
(74) *Attorney, Agent, or Firm* — Xsensus LLP

(57) ABSTRACT

A semiconductor apparatus includes a power semiconductor device, a resin film and a sealing insulating material. The power semiconductor device includes: a first electrode covering a first region on one main surface of the semiconductor substrate; a second electrode formed on the other main surface of the semiconductor substrate; a guard ring formed in a second region outer than the first region; and a non-conductive inorganic film located in the second region and covering the guard ring. The resin film overlaps the guard ring in a plan view, and the resin film on the non-conductive inorganic film has a thickness of 35 μm or more. The resin film is a film of a single layer, and the resin film has an outermost edge in the form of a downwardly spreading fillet. The outermost edge of the resin film is inner than an outermost edge of the semiconductor substrate.

16 Claims, 7 Drawing Sheets

(51) Int. Cl.
    *H01L 23/31*     (2006.01)
    *H01L 29/739*    (2006.01)

(56) References Cited

U.S. PATENT DOCUMENTS

2011/0180897 A1*   7/2011   Pieraerts ............... H01L 21/561
                                                                                                          257/528
2017/0033028 A1*   2/2017   Negishi ............... H01L 23/3171
2018/0138272 A1*   5/2018   Ebihara ............... H01L 23/3185

* cited by examiner (A)

(B)

(C)

(A)

(B)

(A)

(B)

(C)

(A)

(B)

(C)

SEMICONDUCTOR APPARATUS AND METHOD FOR MANUFACTURING THE SAME

TECHNICAL FIELD

The present invention relates to a semiconductor apparatus and a method for manufacturing the same, and more specifically to a semiconductor apparatus having a semiconductor device used to control power and a method for manufacturing the same.

BACKGROUND ART

A power semiconductor apparatus including a power semiconductor device such as an IGBT (Insulated Gate Bipolar Transistor) has a peripheral bonding region such as a guard ring surrounding the IGBT to stabilize main withstand voltage characteristics such as a current value or a voltage value. Furthermore, in order to stabilize a potential distribution in the guard ring, a semi-insulating nonconductive inorganic film is formed on the guard ring.

Furthermore, generally, a power semiconductor apparatus is configured such that a semiconductor chip on which a power semiconductor device such as an IGBT, a diode or the like is mounted is sealed with a sealing insulating material such as a silicone gel. In this state, when a voltage is applied between a collector and an emitter included in the power semiconductor apparatus and serving as electrodes, then, of impurity ions contained in the sealing insulating material, positive ions gather to a ground side and negative ions gather to a high potential side, which polarizes the sealing insulating material. The polarization may change an electric field strength distribution in the guard ring and make main withstand voltage characteristics of current and voltage between the collector and the emitter unstable.

To address this, for example, Japanese Patent Laying-Open No. 2013-191716 (PTD 1) describes that a guard ring is divided and thus formed in a plurality of regions having mutually different impurity concentrations and on an inorganic silicon oxide layer serving as a nonconductive inorganic film a resin film having a thickness of 50 μm or more is formed to relax electric field concentration in the guard ring to suppress polarization of the sealing resin material.

CITATION LIST

Patent Literature

PTL 1: Japanese Patent Laying-Open No. 2013-191716

SUMMARY OF INVENTION

Technical Problem

However, even if the above configuration is applied, Japanese Patent Laying-Open No. 2013-191716 (PTD 1) does not consider the shape of the resin film located at an outermost edge of the inorganic silicon oxide layer serving as a nonconductive inorganic film. For example, the outermost edge has an upwardly convex shape, and the polarization of the sealing resin material may not be suppressed. Further, the resin film is excessively large in thickness, and accordingly, the stress applied to the resin film is increased and the resin film peels off from a surface of the semiconductor device and the semiconductor device is impaired in reliability, and as the resin film is increased in thickness, its production cost is increased or a similar problem arises.

The present invention has been made in view of the above problems, and it is an object of the present invention to provide a highly reliable semiconductor apparatus capable of further stabilizing main withstand voltage characteristics, and a method for manufacturing the same.

Solution to Problem

A semiconductor apparatus of the present invention includes a power semiconductor device, a resin film, and a sealing insulating material. The power semiconductor device includes a first electrode covering a first region on one main surface of a semiconductor substrate, a second electrode formed on the other main surface of the semiconductor substrate, a guard ring formed in a second region outer than the first region, and a nonconductive inorganic film provided in the second region and covering the guard ring. The resin film overlaps the guard ring in a plan view, and the resin film on the nonconductive inorganic film has a thickness of 35 μm or more. The resin film is a single layer film, and the resin film has an outermost edge in the form of a fillet spread downward. The outermost edge of the resin film is inner than an outermost edge of the semiconductor substrate.

Advantageous Effects of Invention

The present invention can provide a highly reliable semiconductor apparatus and a method for manufacturing the same, that can further stabilize main withstand voltage characteristics by controlling a resin film's thickness, layers in number, and outermost edge in shape and position.

DESCRIPTION OF EMBODIMENTS

Hereinafter, an embodiment will be described with reference to the drawings.

Figure 1:
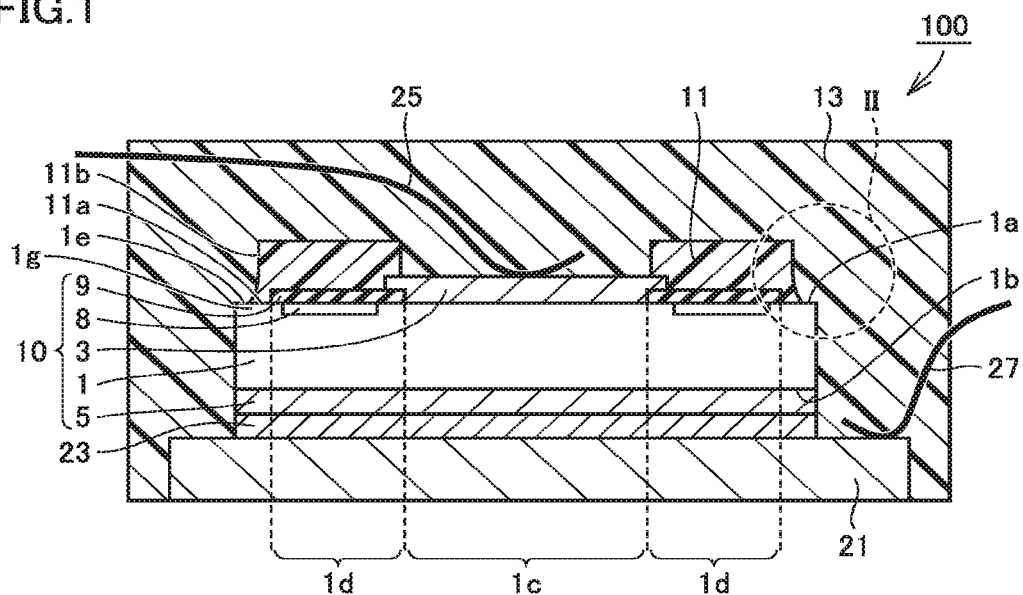
FIG. 1 is a schematic cross section of an example of a configuration of a semiconductor apparatus in an embodiment.

Initially, a configuration of a semiconductor apparatus of the present embodiment will be described with reference to FIGS. 1 to 4. Referring to FIG. 1, a semiconductor apparatus 100 of the present embodiment mainly comprises a power semiconductor device 10, a resin film 11, and a sealing insulating material 13.

Semiconductor apparatus 100 is a power module having a semiconductor device used to control power, and accordingly, power semiconductor device 10 has a device such as an IGBT mounted therein. Power semiconductor device 10 includes a semiconductor chip 1 serving as a semiconductor substrate, a first electrode 3, a second electrode 5, a guard ring 8, and a non-conductive inorganic film 9.

Semiconductor chip 1 is, for example, a thin plate member having a rectangular or square shape in a plan view. That is, semiconductor chip 1 has one main surface $1a$ and the other main surface $1b$ facing away therefrom. Herein, one main surface $1a$ is located on the upper side of FIG. 1, and the other main surface $1b$ is located on the lower side of FIG. 1, that is, a side with the foundation of the entire apparatus disposed, although not shown.

Semiconductor chip 1 is formed of one or more materials selected from the group consisting of, for example, silicon, silicon carbide, and gallium nitride. That is, semiconductor chip 1 may be formed of a material obtained by combining two or more of the above materials. From the viewpoint of causing the semiconductor apparatus to function to present high performance as a power module, it is preferable that semiconductor chip 1 be formed of the above material. Semiconductor chip 1 is of a first conductivity type, that is, for example, formed as an n-type semiconductor substrate.

Semiconductor chip 1, at one main surface $1a$ in particular, has a first region $1c$ and a second region $1d$. First region $1c$ is a relatively inner region of one main surface $1a$ in a plan view, and first electrode 3 is formed to cover this region. On the other main surface $1b$ of semiconductor chip 1, second electrode 5 is formed so as to include a region overlapping first region $1c$ in a planar manner. In FIG. 1, second electrode 5 is formed so as to include the region overlapping first region $1c$ in the planar manner, that is, a region overlapping first electrode 3 in a planar manner, and also extend to a region outer than that region. In FIG. 1, second electrode 5 is formed so as to cover the other main surface $1b$ entirely.

A switching device such as an IGBT is formed by first electrode 3 and second electrode 5, and a region of semiconductor chip 1 sandwiched therebetween.

Second region $1d$ is a region located at one main surface $1a$ of semiconductor chip 1 that is outer than first region $1c$ in a plan view. Guard ring 8 is formed in second region $1d$. Guard ring 8 is formed as an impurity region of a second conductivity type that is for example a p type. Guard ring 8 is formed so as to surround first region $1c$ and first electrode 3, that is, surround the IGBT and the like, in a plan view. It is preferable that guard ring 8 be formed to have its entirety outwardly of first electrode 3 in a plan view.

By forming guard ring 8, when a voltage is applied between a collector and an emitter serving as electrodes included in semiconductor apparatus 100, a depletion layer also extends toward guard ring 8, and the electric field strength of a pn junction in a region adjacent to the emitter is relaxed. This can stabilize a current and a voltage between the collector and the emitter.

Non-conductive inorganic film 9 is provided in second region $1d$ and formed so as to cover guard ring 8. In FIG. 1, non-conductive inorganic film 9 is formed so as to cover guard ring 8 entirely. Non-conductive inorganic film 9 may have a structure to also extend on first electrode 3 in a region on the first electrode 3 side, that is, in an inner region. Non-conductive inorganic film 9 is formed of one or more types of materials selected from the group consisting of silicon oxide and silicon nitride, for example. That is, non-conductive inorganic film 9 may be formed of either silicon oxide or silicon nitride alone, or may be formed of a combination of silicon oxide and silicon nitride.

As shown in FIG. 1, an outermost edge of non-conductive inorganic film 9 closer to first region $1c$ and a region thereof adjacent to the outermost edge may be formed so as to be covered with first electrode 3. Alternatively, the outermost edge of non-conductive inorganic film 9 closer to first region $1c$ may not be covered with first electrode 3 and instead covered directly with resin film 11.

With non-conductive inorganic film 9 of a material such as nitrogen oxide formed on guard ring 8, as described above, a small current flows through non-conductive inorganic film 9 when voltage is applied between e.g., first electrode 3 serving as a collector of the IGBT and e.g., second electrode 5 serving as the emitter of the IGBT. By this small current, the potential of a region between guard ring 8 and non-conductive inorganic film 9 is fixed, and the potential distribution of guard ring 8 is stabilized.

Resin film 11 is formed so as to cover at least a part of power semiconductor device 10 composed of each member described above, at least a part of one main surface $1a$ of semiconductor chip 1, in particular. Resin film 11 is formed so as to cover at least a part of one main surface $1a$ which is a region $11a$ shown in FIG. 1 and located outer than the non-conductive inorganic film, and cover second region $1d$. As shown in FIG. 1, resin film 11 may be formed only in second region $1d$, or it may be formed so as to cover second region $1d$ entirely. Note, however, that resin film 11 may be formed not only in second region $1d$ but also in a partial region of first region $1c$. Thus, resin film 11 is formed on a region overlapping guard ring 8 in a plan view, in particular. Further, resin film 11 may have a manner for example to have its innermost region extending on first region electrode 3.

Further, since non-conductive inorganic film 9 is formed so as to cover guard ring 8 (entirely), resin film 11 is formed so as to directly cover non-conductive inorganic film 9. However, resin film 11 is not required to cover non-conductive inorganic film 9 entirely in a plan view, and may cover non-conductive inorganic film 9 partially.

Resin film 11 is formed of any one selected from the group consisting of polyimide, polyamide and polyamide-imide having both heat resistive and electrically insulating properties. Note, however, that resin film 11 can be composed of any resin material that can ensure electrical insulation.

In FIG. 1, neither non-conductive inorganic film 9 nor resin film 11 is formed directly on the outermost edge of semiconductor chip 1; rather, they are formed so as to have an outermost edge in a region inner than the outermost edge of semiconductor chip 1 in a plan view. That is, the outermost edge of semiconductor chip 1 and the chip's outermost region 1e serving as a region adjacent to an outermost edge of one main surface 1a are not covered with any of non-conductive inorganic film 9 or resin film 11, and instead directly covered with sealing insulating material 13 described later. Note, however, that the chip's outermost region 1e adjacent to the outermost edge of one main surface 1 may alternatively be covered with at least one of non-conductive inorganic film 9 and resin film 11.

Figure 2:
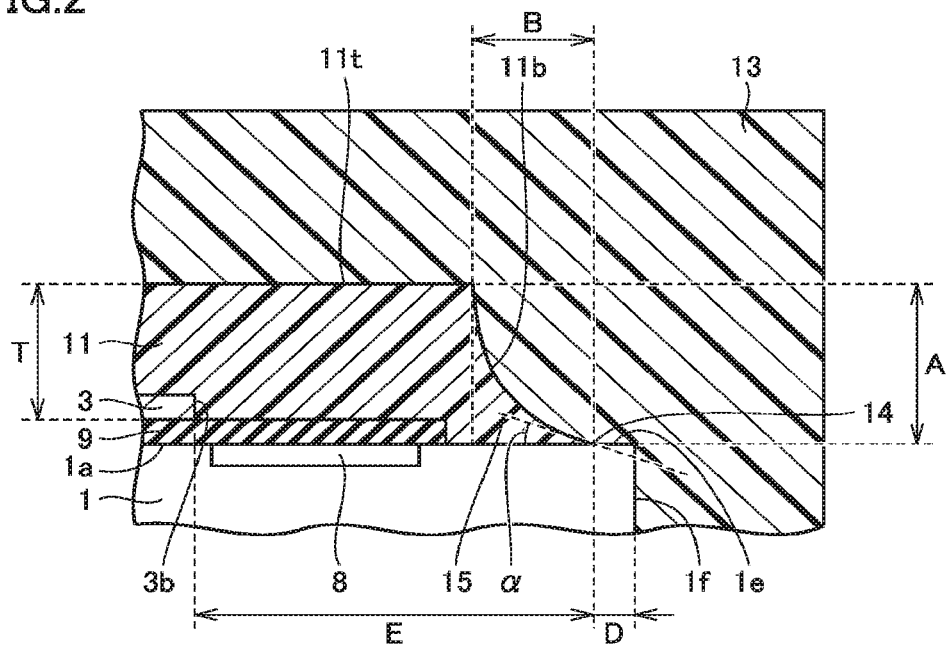
FIG. 2 is a schematic cross section of a configuration and a dimensional definition in a region II shown in FIG. 1 and surrounded with a dotted line.

With reference to FIGS. 1 and 2, resin film 11 is formed as a single-layer film, that is, as a film of a single layer. Resin film 11, substantially in its entirety including a region overlapping guard ring 8 in a plan view and second region 1d, has an uppermost surface 11t spreading flat along one main surface 1a (substantially parallel thereto). However, resin film 11 in its plan view at an outermost edge 11b is not a flat surface spreading along one main surface 1a; rather, it is curved to be convex toward semiconductor chip 1 (that is, convex downward in FIGS. 1 and 2). In addition, outermost edge 11b is curved to have a width in a direction along one main surface 1a of resin film 11 or a rightward and leftward direction in FIGS. 1 and 2 increasing toward semiconductor chip 1 or a lower side in FIGS. 1 and 2.

Although resin film 11 in most of its region has uppermost surface 11t extending along one main surface 1a, a partial region 11a outer than the non-conductive inorganic film directly covers one main surface 1a, another partial region directly covers non-conductive inorganic film 9, and still another partial region directly covers first electrode 3. Accordingly, a thickness T of resin film 11 in a vertical direction in FIG. 2 varies among the regions. Note that herein a thickness of resin film 11 in at least a partial region located exactly on non-conductive inorganic film 9, that is, a region directly covering non-conductive inorganic film 9, is represented as T. In this case, thickness T is 35 μm or more. In other words, thickness T represents resin film 11 as a distance in the vertical direction in FIG. 2 between uppermost surface 11t of resin film 11 spreading along one main surface 1a and non-conductive inorganic film 9, and thickness T is 35 μm or more.

Figure 3:
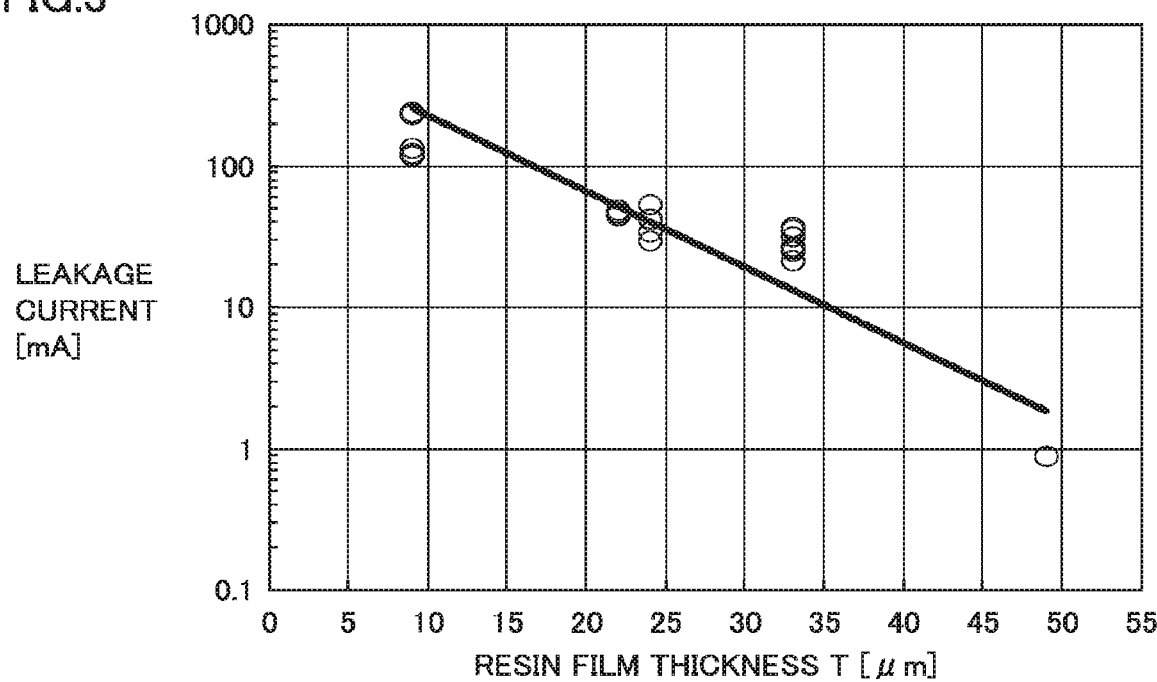
FIG. 3 is a graph representing a relationship between a thickness of a resin film and a leakage current in the semiconductor apparatus of the present embodiment.
Figure 4:
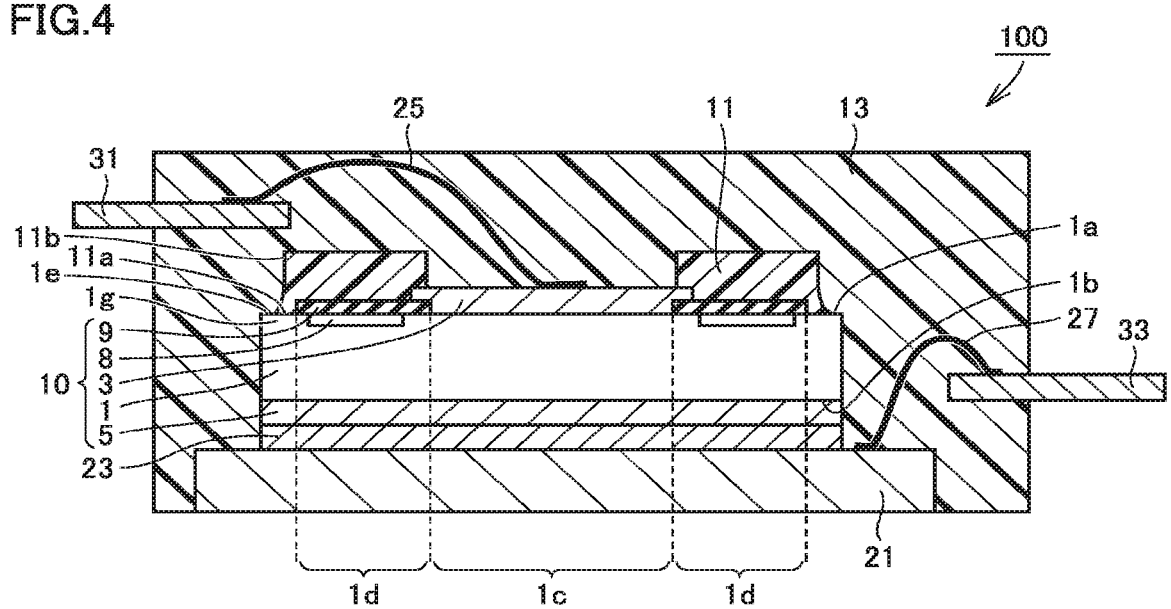
FIG. 4 is a schematic cross section showing a configuration of the semiconductor apparatus of the present embodiment in another example different from FIG. 1.

FIG. 3 shows a graph having a horizontal axis representing thickness T of resin film 11 based on the above definition, and a vertical axis representing a leakage current of a power module including power semiconductor device 10. It can be said that thickness T of resin film 11 is preferably 35 μm or more as a film thickness with which the leakage current of the power module including power semiconductor device 10 is lower than 10 mA. Note, however, that thickness T is preferably less than 50 μm, more preferably 45 μm or less. Still preferably, thickness T is 40 μm or less. Note, however, that when thickness T of resin film 11 is 35 μm or less, the power module's leakage current exceeds 10 mA, and a withstand voltage value required for resin film 11 cannot be satisfied.

In FIG. 2, a dimension B which resin film 11 at a region having the curved outermost edge 11b has in the direction along one main surface 1a of semiconductor chip 1 is smaller than a dimension A which resin film 11 at the region having the curved outermost edge 11b has in a direction traversing one main surface 1a. Dimension A is defined herein as being larger than thickness T of non-conductive inorganic film 9 described above.

Besides, resin film 11 of the present embodiment has a shape and a dimension having a feature as follows: In FIG. 2, a dimension D from an outermost edge 1f of semiconductor chip 1 to outermost edge 11b of resin film 11 in the direction along one main surface 1a is preferably 10 μm or more and 200 μm or less. Further, a dimension E from an outermost edge 3b of first electrode 3 to an outermost region of outermost edge 11b of resin film 11, i.e., the position of outermost edge 11b of resin film 11 in a lowermost part in FIG. 2 (a three-component meeting point 14 in contact with semiconductor chip 1, as will be described later), in the direction along one main surface 1a is preferably 10 μm or more and 1000 μm or less. A tangent 15 to curved outermost edge 11b of resin film 11 at the lowermost portion thereof, i.e., at a point in contact with semiconductor chip 1, and one main surface 1a of semiconductor chip 1 preferably form an angle α of 90° or less.

Referring again to FIG. 1, power semiconductor device 10 is bonded to an underlying electrode 21 by a bonding layer 23. Specifically, second electrode 5 included in power semiconductor device 10 is bonded by bonding layer 23 to electrode 21 formed on a circuit board serving as a foundation (not shown) of semiconductor apparatus 100. Electrode 21 is a material also serving as a heat diffusion plate. While in the above description, electrode 21 is indicated as a part of a circuit board (not shown), instead of electrode 21, an insulating substrate made of an insulating material may be bonded by bonding layer 23. While it is preferable to use solder as bonding layer 23, silver or the like may instead be used.

When second electrode 5 is bonded to electrode 21 as shown in FIG. 1, electrode 21 is electrically connected to second electrode 5. Then, first electrode 3 and electrode 21 are electrically connected to an outside of semiconductor apparatus 100 by an electric wire 25 and an electric wire 27, respectively. Electric wires 25 and 27 may be a linear wire such as a bonding wire, or may be a plate-shaped lead frame connected to first electrode 3 or the like by a bonding material such as solder. In FIG. 1, electric wire 25 and electric wire 27 extend from first electrode 3 and electrode 21, respectively, to the outside of semiconductor apparatus 100 to electrically connect power semiconductor device 10 to the outside of semiconductor apparatus 100. However, referring to FIG. 4, semiconductor apparatus 100 may be provided with external connection terminals 31, 33 extending from inside to outside of sealing insulating material 13 and electric wires 25 and 27 may be connected to external connection terminals 31 and 33, respectively, to electrically connect power semiconductor device 10 to an outside of semiconductor apparatus 100.

Referring again to FIGS. 1 and 2, sealing insulating material 13 is formed so as to cover at least a part of power semiconductor device 10 and resin film 11 as described above. Specifically, sealing insulating material 13 directly covers a side surface of semiconductor chip 1 constituting power semiconductor device 10, the chip's outermost region 1e, an upper surface of first region 3, uppermost surface 11t and outermost edge 11b of resin film 11, a part of an upper surface of electrode 21 and a side surface thereof, electric wires 25 and 27, a part of external connection terminals 31 and 33, and the like, and seals them such that the former wraps the latter. Sealing insulating material 13 is preferably composed of silicone gel or epoxy resin, or it may be composed of these materials in combination.

Figure 6:
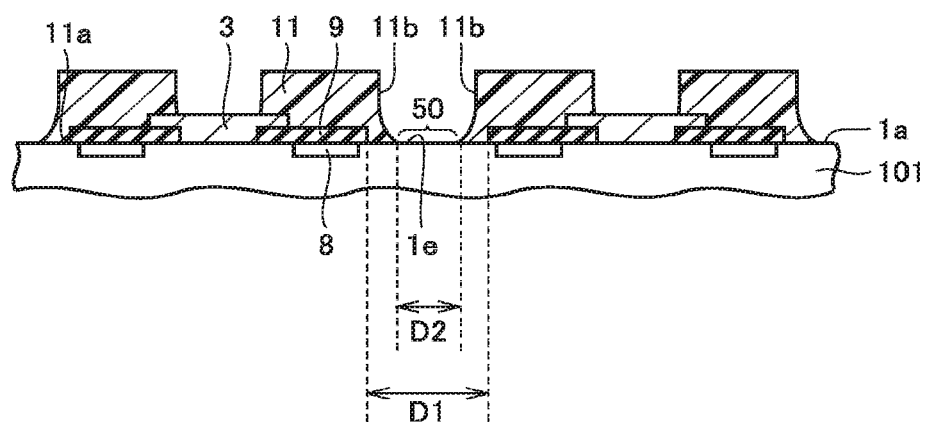
FIG. 6 is a schematic cross section (A) showing a state of a member that is formed through the steps shown in FIG. 5 before it is diced, and a dimensional definition therefor, and a schematic cross section (B) showing a state of the same member after it is diced, and a dimensional definition therefor.
Figure 6:
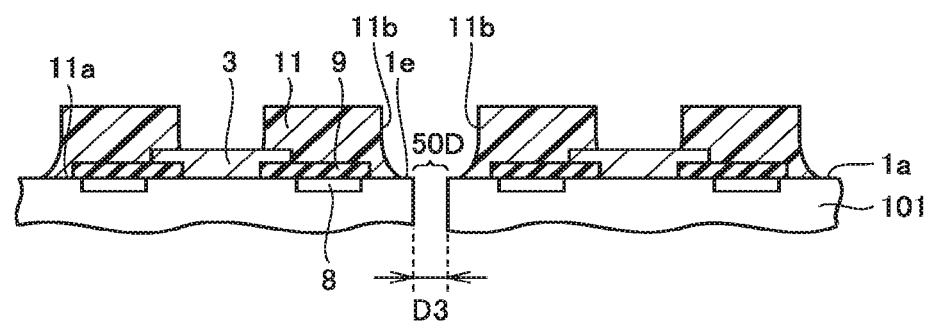
Figure 7:
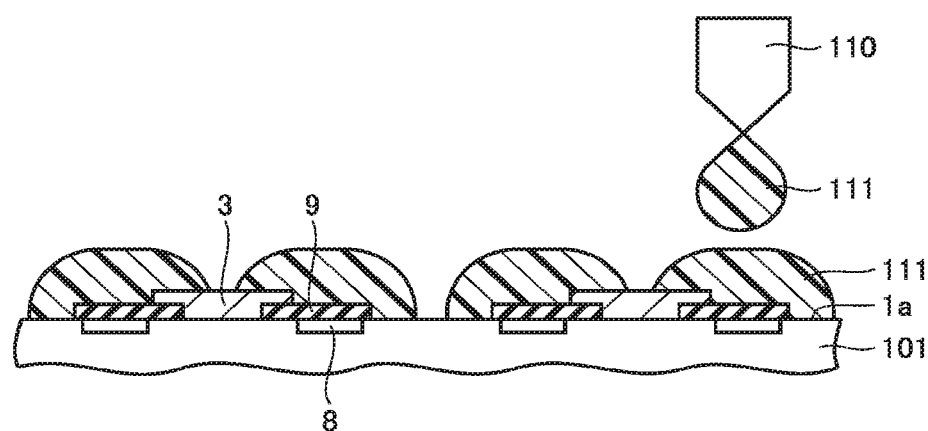
FIG. 7 shows schematic cross sections (A), (B) and (C) showing first, second and third steps for illustrating a second example of the method for manufacturing the semiconductor apparatus of the present embodiment.
Figure 7:
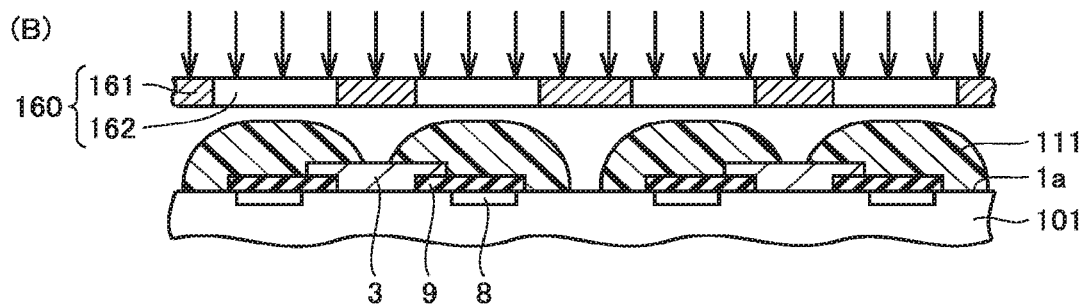
Figure 7:
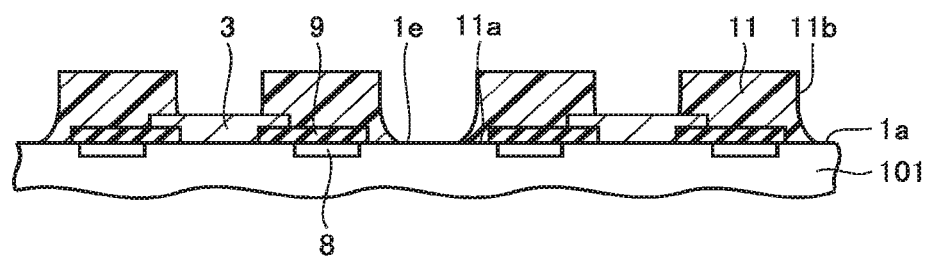

Hereinafter, with reference to FIGS. 5 to 7, of semiconductor apparatus 100 having the above structure, semiconductor chip 1 and a region above semiconductor chip 1, in particular, are manufactured in a method, as will be described hereinafter.

Referring to FIG. 5(A), a chip forming member 101 serving as a semiconductor substrate for forming semiconductor chip 1 having one main surface 1a and the other main surface 1b as described above is prepared. Note that chip forming member 101 means a semiconductor substrate in a state before it is diced to form individual semiconductor chips 1, and chip forming member 101 and semiconductor chip 1 are the same member. Herein, however, the semiconductor substrate before it is diced will be referred to as chip forming member 101 and the semiconductor substrate after it is diced will be referred to as semiconductor chip 1 for differentiation.

Although neither shown nor specifically described, second electrode 5 is formed on the other main surface 1b of chip forming member 101. A pattern of non-conductive inorganic film 9 and first electrode 3 is formed on one main surface 1a through a generally known deposition process and photolithography.

Subsequently, resin film 11 is formed on one main surface 1a. A material 111 which is a material constituting resin film 11 is applied on one main surface 1a with a dispenser 110 so as to cover the pattern of non-conductive inorganic film 9 and first electrode 3. Material 111 to be applied is composed of any one selected from the group consisting for example of polyimide, polyamide and polyamideimide which constitute resin film 11. Herein, as one example, material 111 to be applied is a photosensitive polyimide.

Material 111 to be applied is applied to the entirety of one main surface 1a of chip forming member 101. Specifically, herein, for example, by applying material 111 on one main surface 1a so as to draw 6-mm-wide lines at 5-mm intervals, material 111 can be applied to the entirety of one main surface 1a.

Subsequently, referring to FIG. 5(B), the photosensitive polyimide serving as material 111 applied on one main surface 1a is pre-baked or subjected to a light heat treatment. Subsequently, the material is photolithographically patterned. Specifically, it undergoes typical, known exposure and development processes.

In the exposure process, the material is exposed to light by a light source from above, as indicated in the figure by arrows, through a flat-plate shaped exposure mask 160 having a light shielding region 161 and a non-light shielding region 162. Subsequently, the development process is performed to pattern the photosensitive polyimide.

With reference to FIG. 5(C), for example, the applied material 111 exactly under non-light-shielding region 162 in Fig. (B), that is, the applied material 111 at a portion exposed to light remains, and the applied material 111 exactly under light shielding region 161 in Fig. (B), that is, the applied material 111 at a portion shielded from light is removed. In contrast, for example, a photosensitive material may be used that allows the applied material 111 to be removed exactly under non-light-shielding region 162 and remain exactly under light shielding region 161.

After the applied material 111 is photolithographically patterned (i.e., after the step of applying material 111), chip forming member 101 including the applied material 111 undergoes a heat treatment to solidify the applied material 111. Herein, the heat treatment is a treatment referred to as high-temperature cure. As a result, resin film 11 is formed in which dimension B of outermost edge 11b in the direction along one main surface 1a shown in FIG. 2 is 35 μm or less and a distance between non-conductive inorganic film 9 and flat uppermost surface 11t exactly thereabove, or thickness T, is 35 μm or more.

In FIG. 5(C), two power semiconductor devices 10 can be formed between a left half region and a right half region in the figure. That is, a region between the left half region and the right half region in the figure corresponds to the chip's outermost region 1e. Thereafter, although not shown, in the chip's outermost region 1e, chip forming member 101 is diced or cut in the vertical direction as seen in the figure. As a result, the intermediate product is divided into two power semiconductor devices 10 (or semiconductor chips 1) of the left half region and the right half region shown in FIG. 5(C).

Figure 5:
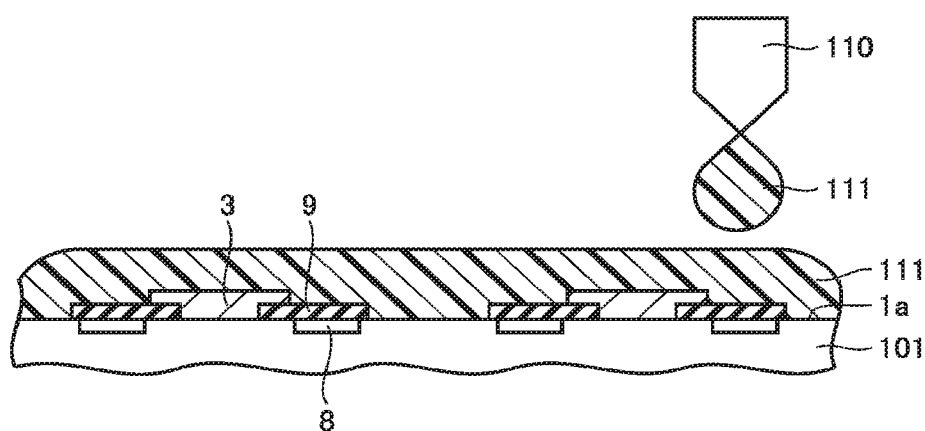
FIG. 5 shows schematic cross sections (A), (B) and (C) showing first, second and third steps, respectively, for illustrating a first example of a method for manufacturing a semiconductor apparatus of the present embodiment.
Figure 5:
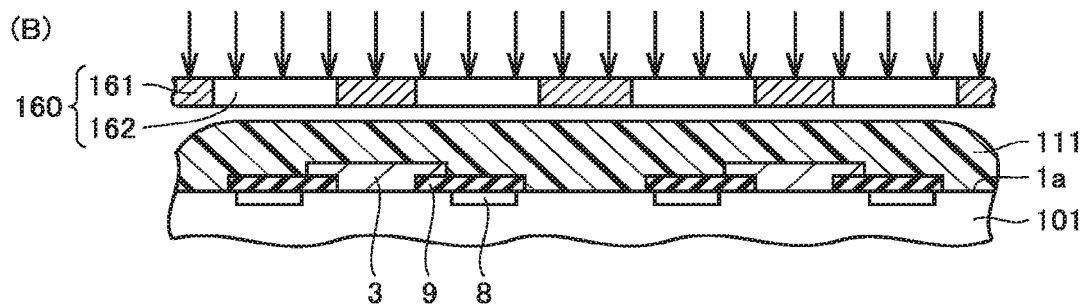
Figure 5:
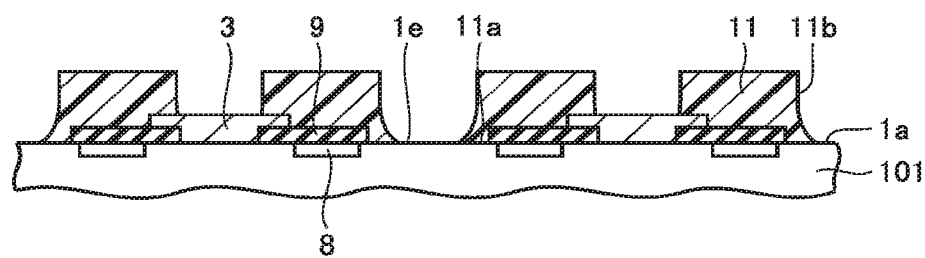

With reference to FIGS. 6(A) and 6(B), while a region between the left half region and the right half region in FIG. 5 corresponding to the chip's outermost region 1e may have non-conductive inorganic film 9 and resin film 11 formed therein, it is preferable that the region is free of the films, since this region is a dicing area 50 in which chip forming member 101 is diced and thus divided into individual semiconductor chips 1, and if non-conductive inorganic film 9 and resin film 11 are formed in this region, the dicing blade may have a surface loaded with constituent materials of non-conductive inorganic film 9 and resin film 11. In other words, dicing area 50 without non-conductive inorganic film 9 or resin film 11 formed therein can reduce loading on a surface of the dicing blade. To perform a process in this way, resin film 11 has outermost edge 11b inner than outermost edge 1f of semiconductor chip 1 in a plan view, and the chip's outermost region 1e corresponding to this region is directly sealed by sealing insulating material 13.

As shown in FIG. 6(A), a distance D1 between non-conductive inorganic films 9 in the left and right half regions shown in FIG. 5 is larger than a distance D2 between resin films 11 in those regions, and region 11a outer than the non-conductive inorganic film in which resin film 11 is partially formed directly on one main surface 1a of semiconductor chip 1 is formed. As shown in FIG. 6(B), distances D1 and D2 are both larger than a dimension D3 of a width 50D of the dicing blade indicating a width of a region cut by the dicing blade. In this way, neither non-conductive inorganic film 9 nor resin film 11 will be cut by the dicing blade.

Subsequently, power semiconductor device 10 is bonded to electrode 21 by bonding layer 23 such as solder, and electric wire 25 is connected to first electrode 3 and electric wire 27 is connected to electrode 21. Thereafter, the whole is sealed with sealing insulating material 13. Semiconductor apparatus 100 as the power module shown in FIG. 1 is thus formed.

In FIG. 5, dispenser 110 applies material 111 to the entirety of one main surface 1a. In contrast, referring to FIG. 7(A), material 111 to be applied may be fed to thereby draw a plurality of lines on one main surface 1a with a spacing therebetween larger than the line's width to draw the plurality of lines on one main surface 1a only in a partial region. In that case, it is preferable that material 111 to be applied is fed to a position at which guard ring 8 disposed substantially directly under non-conductive inorganic film 9 (not shown) serves as a center in a widthwise direction, in particular.

By applying material 111 through dispenser 110 linearly as shown in FIG. 7(A), a film of the applied material 111 can be formed stereoscopically, rather than in a planar shape, and thus have an increased area. This can prevent a residual volatile component from finally remaining in resin film 11. Further, in this step, material 111 is formed in a linear pattern significantly larger than thickness T of resin film 11 to be finally obtained, i.e., about 35 μm or more and 50 μm or less. Therefore, resin film 11 can be formed as a film of a single layer. Thus forming material 111 into a sufficiently thick pattern as compared with resin film 11 to be finally obtained can dispense with an additional process for adding a thickness to the film, and thus avoid an increased cost otherwise accompanying the additional process.

With reference to FIG. 7(B), subsequently, as done with reference to FIG. 5(B), the applied material 111 is photographically patterned. Herein, it is preferable that exposure mask 160 be positionally adjusted so that material 111 mainly remains in a region exactly above guard ring 8 and non-conductive inorganic film 9. This can remove a wet spread portion of the applied material 111 of the photosensitive polyimide, and thus pattern material 111 in any shape matching a device pattern on chip forming member 101 without waste.

With reference to FIG. 7(C), as done in the step shown in FIG. 5(C), chip forming member 101 is heat-treated, and thereafter a process is performed similarly as when the FIG. 5 process is performed. Semiconductor apparatus 100 as the power module shown in FIG. 1 is thus formed.

Hereinafter, a function and effect of the present embodiment will be described while describing a principle of an operation of semiconductor apparatus 100 of the present embodiment and a comparative example of semiconductor apparatus 100.

Figure 8:
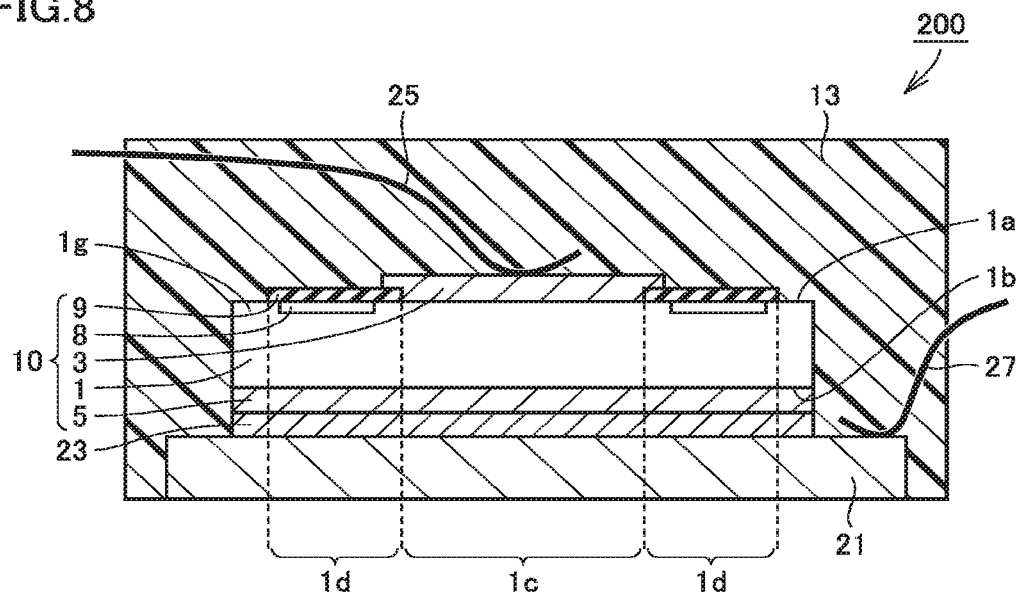
FIG. 8 is a schematic cross section showing a configuration of a semiconductor apparatus in a comparative example.

Referring to FIG. 8, a semiconductor apparatus 200 serving as a comparative example for the present embodiment basically has the same configuration as semiconductor apparatus 100 of FIG. 1. Accordingly, any component of semiconductor apparatus 200 of FIG. 8 that is identical to that of semiconductor apparatus 100 of FIG. 1 is identically denoted and will not be described redundantly. Note that in semiconductor apparatus 200 of FIG. 8, resin film 11 is not formed, and sealing insulating material 13 is also disposed in a region where resin film 11 shown in FIG. 1 is otherwise disposed. Accordingly, sealing insulating material 13 is formed so as to also cover a side surface of first electrode 3 and an upper surface of non-conductive inorganic film 9.

The semiconductor apparatus has its withstand voltage evaluated as follows: a voltage is applied between a collector, e.g., first electrode 3 of FIG. 8, and an emitter, e.g., second electrode 5 of FIG. 8. The withstand voltage is a withstand voltage when the semiconductor apparatus is off, and a withstand voltage corresponding to the semiconductor apparatus's rated voltage needs to be ensured. For example, for semiconductor apparatuses having rated voltages of 6.5 kV, 4.5 kV, and 3.3 kV, voltages of 6.5 kV, 4.5 kV, and 3.3 kV, respectively, are applied between first electrode 3 as a collector and second electrode 5 as an emitter.

At the time, an electrical connection is made so that an in-chip outermost region 1g in semiconductor chip 1 outer than first electrode 3 and guard ring 8 has a high potential and second electrode 5 has a ground potential. Note that herein in-chip outermost region 1g is a region immediately under a region on one main surface 1a and adjacent to outermost edge 1f, i.e., the chip's outermost region 1e, that is, an n-type region in semiconductor chip 1 adjacent directly under the chip's outermost region 1e. Second electrode 5 connected so as to have the ground potential is disposed so as to include a region inner than guard ring 8 in a plan view.

Non-conductive inorganic film 9 formed on guard ring 8 has an upper surface directly covered with sealing insulating material 13. In the region of sealing insulating material 13 on the upper surface of non-conductive inorganic film 9, positive ions gather in an inner region in a plan view and negative ions gather in an outer region in the plan view. Note that the positive and negative ions of sealing insulating material 13 are impurity ions included in, for example, a gel constituting sealing insulating material 13. As sealing insulating material 13 in the outer region in a plan view, in particular, that is, a region exactly above in-chip outermost region 1g is negatively polarized, the region in semiconductor chip 1 exactly thereunder, or in-chip outermost region 1g, which is originally the portion of an n-type drift layer, has a p-type layer formed therein as an inversion layer.

In this state, a voltage is applied between the collector and the emitter (for example, between first electrode 3 and second electrode 5). Then, in semiconductor chip 1, from an interface between the p-type layer as the inversion layer and the n-type drift layer exactly thereunder, a depletion layer will extend mainly toward the n-type drift layer. That is, as an inverted p-type layer is formed in in-chip outermost region 1g, the depletion layer easily extends outwardly of its original position. Accordingly, the depletion layer adjacent to the n-type layer in in-chip outermost region 1g of semiconductor chip 1 has distortion in how it extends. This may result in an excessively increased electric field strength in semiconductor chip 1 at in-chip outermost region 1g, and a leakage current caused in semiconductor chip 1 and thereby reduced withstand voltage characteristics. Although non-conductive inorganic film 9 formed in second region 1d so as to cover guard ring 8 can relax an electric field strength in semiconductor chip 1 attributed to polarization of ions in sealing insulating material 13, such is insufficient as a countermeasure.

To address such a problem of the comparative example, referring again to FIG. 1, semiconductor apparatus 100 of the present embodiment includes resin film 11 to cover at least a part of one main surface 1a of semiconductor chip 1. Resin film 11 having thickness T (see FIG. 2) of 35 μm or more between uppermost surface 11t spreading along one main surface 1a and non-conductive inorganic film 9 exactly thereunder allows a leak current of semiconductor apparatus 100 to be 10 mA or less. This is because of the following reason:

Resin film 11 formed on a region of semiconductor chip 1 overlapping guard ring 8, or second region 1d, in particular, will be located between a relatively outer region of semiconductor chip 1 including second region 1d and sealing insulating material 13. As a result, the relatively outer region of semiconductor chip 1 including second region 1d, e.g., in-chip outermost region 1g, is less likely to be affected by polarization of ions in sealing insulating material 13. In other words, for example, the inverted p-type layer is less likely to be formed in in-chip outermost region 1g.

This can reduce a possibility of an excessively increased electric field strength in semiconductor chip 1 at in-chip outermost region 1g, and hence a leakage current in semiconductor chip 1. This is because a possibility of forming a distorted depletion layer in in-chip outermost region 1g is reduced and an electric field strength and depletion layer as designed can be obtained at a position as designed. That is, an electric field strength at the time when semiconductor apparatus 100 is driven can be relaxed. Furthermore, resin film 11 formed to be larger in thickness enhances an effect of protecting an interior of semiconductor chip 1 from an influence of polarization of ions in sealing insulating material 13. Accordingly, as shown in FIG. 3, resin film 11 larger in thickness T allows a leakage current to be smaller. In this sense, thickness T of resin film 11 is preferably 35 μm or more.

However, if resin film 11 has an excessively large thickness, stress applied to resin film 11 is increased and resin film 11 peels off from a surface of semiconductor chip 1 and semiconductor chip 1 may be impaired in reliability or a similar problem may arise. Accordingly, thickness T of resin film 11 is preferably less than 50 μm, more preferably 45 μm or less. Still preferably, thickness T is 40 μm or less.

Resin film 11 is formed of any one selected from the group consisting of polyimide, polyamide and polyamide-imide. This enhances an effect of resin film 11 to relax an effect toward semiconductor chip 1 that is caused by polarization of sealing insulating material 13. Further, resin film 11 of the above material can also provide an effect of relaxation of stress toward semiconductor chip 1 and an effect of enhancing heat resistance and electrical insulation for semiconductor chip 1.

Resin film 11 has outermost edge 11b inner than outermost edge 1f of semiconductor chip 1 in a plan view. This is because dicing area 50 is provided in chip forming member 101 in order to suppress loading on a surface of the dicing blade in the step of dicing semiconductor chip 1, as has been discussed above. Non-conductive inorganic film 9 is similarly discussed, that is, has an outermost edge inner than outermost edge 1f of semiconductor chip 1 in a plan view.

Figure 9:
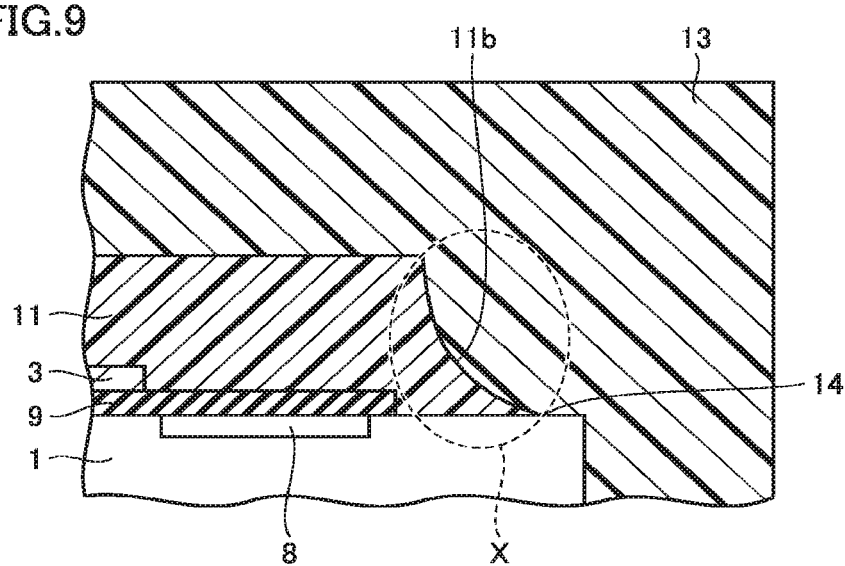
FIG. 9 is an enlarged schematic cross section showing a manner of a point at which the three components of a semiconductor chip, a resin film and a sealing insulating material meet, and a region adjacent to the point in the present embodiment.
Figure 10:
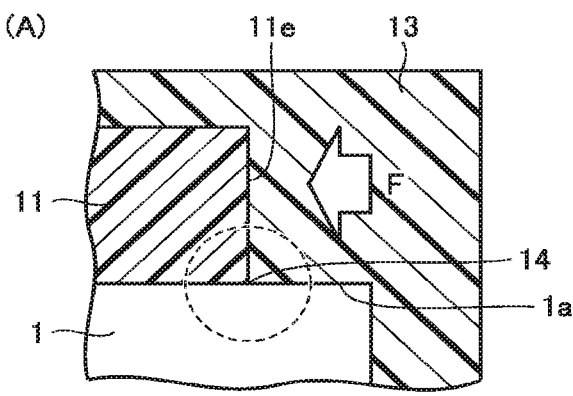
FIG. 10 is schematic enlarged cross sections (A), (B) and (C) showing configurations in a region X shown in FIG. 9 and surrounded with a dotted line, as presented in first, second and third examples, respectively, of a manner different from the present embodiment, and application of stress in that region.
Figure 10:
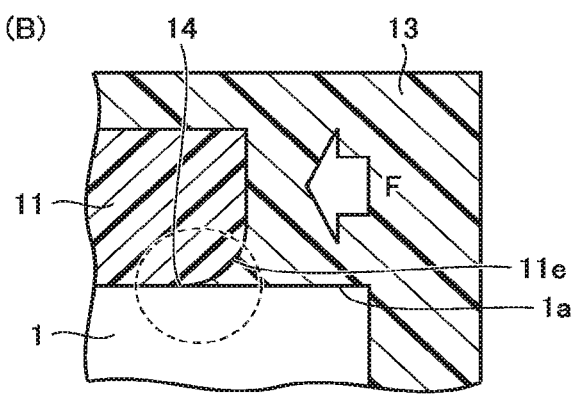
Figure 10:
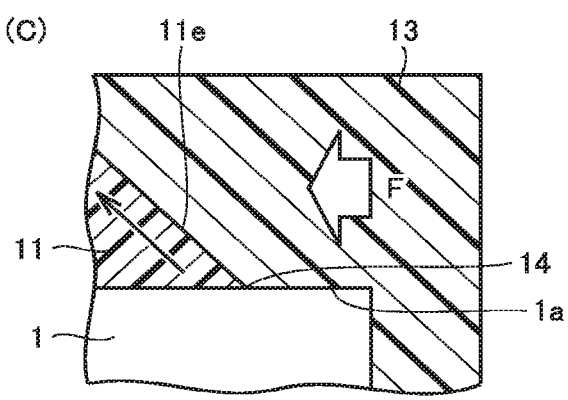

With reference to FIG. 9, outermost edge 11b of resin film 11 is in the form of a fillet curved to be convex toward semiconductor chip 1 and allowing resin film 11 to be increased in width downward. This allows outermost edge 11b to have a lowermost point suppressing stress concentration at three-component meeting point 14 where semiconductor chip 1, resin film 11 and sealing insulating material 13 meet, and hence suppressing peeling of resin film 11. This will be described with reference to FIG. 10.

Referring to FIG. 10(A), for example, let us consider a case where resin film 11 has outermost edge 11e extending in the vertical direction in the figure so as to be substantially orthogonal to one main surface 1a of semiconductor chip 1. The constituent members of semiconductor apparatus 100 have different coefficients of linear expansion, and thermally shrink accordingly. For this reason, a stress F is applied from outside of outermost edge 11e, as indicated by an arrow in the figure. Then, resin film 11 expands and contracts to absorb stress F, and three-component meeting point 14 experiences a force acting to peel resin film 11 off one main surface 1a of semiconductor chip 1.

With reference to FIG. 10(B), let us consider an example in which resin film 11 extends in the vertical direction in the figure so as to be substantially orthogonal to one main surface 1a of semiconductor chip 1, although resin film 11 is curved such that its rightward and leftward width along one main surface 1a is reduced in a region adjacent to one main surface 1a in a direction opposite to outermost edge 11b in FIG. 9, that is, on the semiconductor chip 1 side (or a lower side in the figure). In this case, as well as that shown in FIG. 10(A), due to stress F applied as indicated by an arrow in the figure, three-component meeting point 14 experiences a force acting to peel resin film 11 off from one main surface 1a of semiconductor chip 1.

To address this, with reference to FIG. 10(C), if in a region adjacent to three-component meeting point 14 outermost edge 11e has a shape allowing resin film 11 to have a rightward and leftward width increasing toward semiconductor chip 1 (or the lower side), and stress F is applied, resin film 11 thermally shrinks in a direction along outermost edge 11e as indicated by a thin arrow in the figure. Thus, in FIG. 10(C), peeling of resin film 11 from semiconductor chip 1 at three-component meeting point 14 can be prevented. Thus, according to the present embodiment, resin film 11 has outermost edge 11b having a downwardly convex curved shape having a shape spreading toward the lower side of resin film 11, similarly as shown in FIG. 10(C), and can suppress peeling otherwise caused at three-component meeting point 14 due to stress F as described above.

However, if outermost edge 11b has widthwise dimension B (see FIG. 2) made excessively long, an unnecessary deposition is provided in a region in which one main surface 1a is exposed from resin film 11, that is formed by dicing area 50 as the chip's outermost region 1e, and there is a possibility of loading when dicing. Further, if the chip's outermost region 1e is made wider so as to match the rightward and leftward width of outermost edge 11b serving as a fillet, semiconductor chip 1 in a plan view has an increased size inviting an increased manufacturing cost.

Accordingly, it is preferable to form outermost edge 11b of resin film 11 to allow dimension B shown in FIG. 2 to be smaller than dimension A, while considering that the currently used dicing blade has width 50D having dimension D3 (see FIG. 5(B)) of 35 μm or less. This can reduce width B of the fillet of outermost edge 11b (see FIG. 2) and hence the chip's outermost region 1e obtained by the dicing area. This can in turn reduce semiconductor chip 1 in size in a plan view and hence its manufacturing cost. In addition, loading when dicing can also be suppressed.

The method for manufacturing semiconductor apparatus 100, in the process for forming resin film 11, in particular, has the following function and effect: Normally, in a process for manufacturing a semiconductor apparatus, spin coating is employed when material 111 to be applied, such as photoresist or polyimide, is fed to a main surface of a semiconductor substrate. In that case, however, it is extremely difficult to allow resin film 11 to have a uniform thickness on the main surface of the semiconductor substrate after the semiconductor substrate is heat-treated, since spin coating centrifugally spreads a film, and allowing resin film 11 finally formed after a heat treatment to have a thickness of 35 μm or more requires applying material 111 to have an initial thickness of 50 μm or more. For example, when forming resin film 11 having a thickness of 50 μm at a center in a plan view of a round semiconductor wafer serving as a semiconductor substrate, material 111 applied by spin coating will have at a peripheral edge of the semiconductor substrate a thickness of about 1.5 to 2 times of that at the center.

Material 111 is thus applied and thereafter, in prebaking with a hot plate to dry a volatile component of a solvent contained in the applied material 111, when the intermediate product is heated from beneath the semiconductor wafer, a difference arises in the latent heat in the film of the applied material 111 due to a difference in thickness of the film of the applied material 111. For this reason, natural convection called Rayleigh-Benard convection arises in the hot plate. Accordingly, the solvent contained in the applied material 111 is volatilized while controlling so as to prevent the solvent from remaining in the film of the applied material 111 as the semiconductor wafer has a surface dried and cured. However, if the film of the applied material 111 is excessively large in thickness, the amount of the volatile component of the solvent in the film will be excessively large with reference to the surface area of the film. Then, the surface of the film would be cured before drying the volatile component in the film is completed, and the residual volatile component which has not been volatilized and thus remained in the film is thereafter volatilized in the film and thus causes void in the film.

In order to avoid such a problem, when resin film 11 having a large thickness is to be formed, a thin film is initially formed and pre-baked, and thereafter, on that thin film, material 111 to be applied is fed and a spin coating step is performed to increase the film in thickness. However, such a process entails an increased number of steps and hence invites an increased cost. Further, if resin film 11 is thus formed by feeding material 111a plurality of times, a boundary portion is formed as a gap between a layer formed by a first deposition and a layer formed by a second deposition. In such a case, there is a possibility that, with the gap acting as a starting point, the layer formed by the first deposition and the layer formed by the second deposition may peel off from each other. If such peeling occurs, the above-described electric field relaxation effect is weakened in the peeled portion, and the semiconductor apparatus may be impaired in reliability.

Accordingly, in the present embodiment, dispenser 110 is used to apply material 111 constituting resin film 11 on one main surface 1a. This can reduce variation in thickness of a film of the applied material 111 between regions on the semiconductor wafer, i.e., on one main surface 1a of chip forming member 101 shown in FIGS. 5 and 7, and form resin film 11 of polyimide internally free of voids and having thickness T of 35 μm or more after a heat treatment. In addition, resin film 11 is formed to have a large thickness in the form of a single layer and does not require an increased process accompanying increasing a thickness, and can thus suppress an increase in a cost otherwise attributed to the increased process. Furthermore, resin film 11 formed as a single-layer film can suppress peeling between a plurality of layers which otherwise resin film 11 would have, and reduction of an electric field relaxation effect.

In the spin coating step, material 111 fed on the semiconductor wafer will partially be removed from the semiconductor wafer by centrifugal force during subsequent rotation. Thus, only about 60% of material 111 initially fed will contribute as resin film 11. Therefore, when the spin coating step is used, material 111 is used inefficiently. In contrast, when material 111 is fed via a dispenser, as done in the present embodiment, 100% of material 111 initially fed can contribute as resin film 11 and thus be used efficiently. The present embodiment can also achieve a significantly reduced cost in this point of view.

Further, photolithographically patterning the fed, applied material 111 can remove a portion of the applied material 111 for example of polyimide that has wet-spread in an unintended area. As a result, a pattern of resin film 11 of any shape matching the pattern of the semiconductor device on one main surface 1a of semiconductor chip 1 without waste can be formed.

The features described above may be applied in an appropriate combination within a technologically consistent range.

It should be understood that the embodiments disclosed herein have been described for the purpose of illustration only and in a non-restrictive manner in any respect. The scope of the present invention is defined by the terms of the claims, rather than the description above, and is intended to include any modifications within the meaning and scope equivalent to the terms of the claims.

REFERENCE SIGNS LIST

1: semiconductor chip; 1a: one main surface; 1b: other main surface; 1c: first region; 1d: second region; 1e: chip's outermost region; 1f, 3b, 11b, 11e: outermost edge; 1g: in-chip outermost region; 3: first electrode; 5: second electrode; 8: guard ring; 9: non-conductive inorganic film; 10: power semiconductor device; 11: resin film; 11a: region outer than non-conductive inorganic film; 11t: uppermost surface; 13: sealing insulating material; 14: three-component meeting point; 15: tangent; 21: electrode; 23: bonding layer; 25, 27: electric wire; 50: dicing area; 100, 200: semiconductor apparatus; 110: dispenser; 111: material applied; 160: exposure mask; 161: light shielding region; 162 non light shielding region.

The invention claimed is:

1. A semiconductor apparatus, comprising:
   a power semiconductor device including a semiconductor substrate of a first conductivity type having one main surface and the other main surface facing away from the one main surface;
   a resin film formed so as to at least partially cover the one main surface of the semiconductor substrate; and
   a sealing insulating material formed so as to at least partially cover the power semiconductor device and the resin film,
   the power semiconductor device including:
   a first electrode formed so as to cover a first region on the one main surface of the semiconductor substrate;
   a second electrode formed so as to include a region located on the other main surface and overlapping the first region in a planar manner;
   a guard ring of a second conductivity type formed in the one main surface of the semiconductor substrate at a second region outer in a plan view than the first region; and
   a non-conductive inorganic film located in the second region and formed so as to cover the guard ring,
   the resin film being formed on a region overlapping the guard ring in a plan view,
   the resin film having a thickness of 35 μm or more at at least a part of the resin film located exactly above the non-conductive inorganic film,
   the resin film being a film of a single layer,
   the resin film having an outermost edge in contact with the one main surface and a concave curved surface that curves from an uppermost surface of the resin film toward a peripheral edge of the one main surface so that a width of the resin film is larger in a direction toward the power semiconductor device than on the uppermost surface, the resin film covering a peripheral corner of the non-conductive inorganic film,
   the outermost edge of the resin film being inside an outermost edge of the semiconductor substrate in a plan view, and
   an entirety of the guard ring is arranged outside of the first electrode in a plan view, and the non-conductive inorganic film is in direct contact with the first electrode.

2. The semiconductor apparatus according to claim 1, wherein the resin film is formed of any one selected from the group consisting of polyimide, polyamide and polyamide-imide.

3. The semiconductor apparatus according to claim 1, wherein a dimension which the resin film at a region having the curved outermost edge has in a direction toward the periphery of the power semiconductor device is smaller than a dimension which the resin film at the region having the curved outermost edge has in a direction traversing the one main surface.

4. The semiconductor apparatus according to claim 1, wherein the semiconductor substrate is formed of one or more materials selected from the group consisting of silicon, silicon carbide, and gallium nitride.

5. The semiconductor apparatus according to claim 1, wherein the non-conductive inorganic film is formed of one or more materials selected from the group consisting of silicon oxide and silicon nitride.

6. A method for manufacturing a semiconductor apparatus according to claim 1, comprising:
preparing the semiconductor substrate; and
forming the resin film,
the step of forming the resin film including:
applying a material on the one main surface with a dispenser to constitute the resin film; and
heat-treating the semiconductor substrate after the applying the material.

7. The method for manufacturing a semiconductor apparatus according to claim 6, wherein the step of forming the resin film further includes photolithographically patterning the material after the step of applying the material.

8. The semiconductor apparatus according to claim 1, wherein the outermost edge of the resin film is closer to the peripheral edge of the one main surface than an outermost edge of the non-conductive inorganic film.

9. The semiconductor apparatus according to claim 1, wherein the outermost edge of the resin film is closer to the peripheral edge of the one main surface than an outermost edge of the guard ring.

10. The semiconductor apparatus according to claim 1, wherein an entirety of the one main surface is arranged along a same plane, and a peripheral edge of the one main surface is arranged outside of the guard ring in a plan view.

11. The semiconductor apparatus according to claim 1, wherein the non-conductive inorganic film contacts the guard ring entirely along a same plane.

12. The semiconductor apparatus according to claim 1, wherein the first region includes an entirety of the one main surface that is surrounded by the non-conductive inorganic film, and the first electrode is in direct contact with an entirety of the first region.

13. The semiconductor apparatus according to claim 1, wherein a first wire is bonded to an upper surface of the first electrode to provide a first electrical connection outside of the semiconductor apparatus.

14. The semiconductor apparatus according to claim 13, wherein a second wire is bonded to an upper surface of the second electrode to provide a second electrical connection outside of the semiconductor apparatus.

15. The semiconductor apparatus according to claim 1, wherein the curved outermost edge of the resin film overlaps the one main surface of the semiconductor substrate in the plan view, and the outermost edge of the resin film is in direct contact with the one main surface of the semiconductor substrate.

16. The semiconductor apparatus according to claim 1, wherein the outermost edge of the resin film in contact with the one main surface is the thinnest portion of the resin film, in a direction from the uppermost surface of the resin film toward the one main surface of the semiconductor substrate.

* * * * *